(12) United States Patent
Li et al.

(10) Patent No.: US 9,012,130 B2
(45) Date of Patent: *Apr. 21, 2015

(54) METHOD OF FABRICATING CAPACITIVE TOUCH PANEL

(71) Applicants: Innocom Technology (Shenzhen) Co., Ltd., Shenzhen (CN); Innolux Corporation, Miao-Li County (TW)

(72) Inventors: Chao-Sung Li, Miao-Li County (TW); Lien-Hsin Lee, Miao-Li County (TW); Kai Meng, Shenzhen (CN)

(73) Assignees: Innocom Technology (Shenzhen) Co., Ltd, Shenzhen (CN); Innolux Corporation, Miao-Li County (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/310,584

(22) Filed: Jun. 20, 2014

(65) Prior Publication Data

US 2014/0298643 A1    Oct. 9, 2014

Related U.S. Application Data

(60) Continuation of application No. 14/023,636, filed on Sep. 11, 2013, now Pat. No. 8,790,865, which is a division of application No. 12/720,644, filed on Mar. 9, 2010, now Pat. No. 8,557,508.

(30) Foreign Application Priority Data

Apr. 13, 2009   (CN) .......................... 2009 1 0301532

(51) Int. Cl.
| | |
|---|---|
| H01H 65/00 | (2006.01) |
| H01L 21/31 | (2006.01) |
| G02F 1/133 | (2006.01) |
| G06F 3/044 | (2006.01) |

(52) U.S. Cl.
CPC ................ *G02F 1/133* (2013.01); *G06F 3/044* (2013.01); *G06F 2203/04111* (2013.01)

(58) Field of Classification Search
USPC ..................................... 430/319, 320; 216/17
See application file for complete search history.

(56) References Cited

U.S. PATENT DOCUMENTS

| | | |
|---|---|---|
| 4,550,221 A | 10/1985 | Mabusth |
| 8,557,508 B2 | 10/2013 | Li et al. |
| 2011/0069033 A1 | 3/2011 | Meng et al. |

*Primary Examiner* — Daborah Chacko Davis
(74) *Attorney, Agent, or Firm* — WPAT, PC; Justin King

(57) ABSTRACT

The present disclosure relates to a method of fabricating a capacitive touch pane where a plurality of groups of first conductive patterns are formed along a first direction, a plurality of groups of second conductive patterns are formed along a second direction, and a plurality of connection components are formed on a substrate. Each first conductive pattern is electrically connected to another adjacent first conductive pattern in the same group by each connection component and each group of the second conductive patterns is interlaced with and insulated from each group of the first conductive patterns. Next, a plurality of curved insulation mounds are formed to cover the first connection components. Then, a plurality of bridge components are formed to electrically connect each second conductive pattern with another adjacent second conductive pattern in the same group.

10 Claims, 14 Drawing Sheets

METHOD OF FABRICATING CAPACITIVE TOUCH PANEL

CROSS-REFERENCE TO RELATED APPLICATIONS

This application is a continuation application of co-pending U.S. application Ser. No. 14/023,636, which is a divisional application of U.S. Pat. No. 8,557,508, filed on Mar. 9, 2010, which claims the priority to China Patent Application No. 200910301532.8 filed in the China Patent Office on Apr. 13, 2009, which is herein incorporated by reference in its entirety.

BACKGROUND

1. Technical Field

The present disclosure relates to a method of fabricating a touch panel, especially to a method of fabricating a touch panel that is simple and has high accuracy.

2. Description of Related Art

In today's markets, which offer a variety of consumer electronics products, the touch panel has been increasingly used in personal digital assistants (PDA), mobile phones, notebooks and other portable electronic products, as well as personal computers and digital home appliance systems as a communication interface between users and the electronic devices. When using the touch panel, users can directly operate the electronic devices and make commands through screen objects displayed on the panel, providing a more user-friendly operation interface. In addition, electronic products are currently designed to be light, thin, short and small, and it is therefore desirable to economize the space dedicated to some traditional input devices, such as buttons, keyboards, and mice, in product design. Display devices with touch panels are a current trend, and are one of the key components of all kinds of electronic products.

Conventional touch panels can be categorized into capacitive, resistive or surface wave touch panels in accordance with their detection principle, each having different advantages and disadvantages, and different application fields. The resistive touch panel includes an upper transparent conductive film and a lower transparent conductive film that are superimposed to each other. When the user presses the touch panel, strength of the depression makes the upper electrode connect to the lower electrode, and the touch point position can be calculated through the measurement of the voltage change. The surface wave touch screen has a wave source, usually infrared or ultrasound, on one side of the X-axis and Y-axis of the panel and has a receiver on the other side. When a user touches the panel, the waveform is interfered with, and the interference graph can be captured by the receiver, such that the position can be calculated. The capacitive touch screen provides a uniform electric field at the four corners of the panel, and the touch position can be measured by detecting changes of capacitance of the panel.

Due to the advantages of being dust-proof, and having high temperature resistance and multi-touch capability, conventional capacitive touch panels are widely used in portable electronic products. However, a conventional capacitive touch panel usually includes a stack of at least five films, making it hard to achieve a high light transmission ratio, which may result in low display quality. And, because of its large volume and heavy weight, conventional capacitive touch panels are also difficult to integrate into current electronic devices, which are designed to be thin and light. Moreover, the multilayer stacking structure requires a more cumbersome fabrication process, especially when the sensing conductive films are located on both sides of a transparent substrate, rendering the manufacturing process difficult to upgrade.

SUMMARY

An embodiment of the disclosure provides a method of fabricating a capacitive touch panel. The method comprises the following steps. Firstly, a substrate is provided. Then, a plurality groups of first conductive patterns arranged in a first direction, a plurality groups of second conductive patterns arranged in a second direction, and a plurality of connection components are formed on the substrate. Each first conductive pattern is electrically connected to another adjacent first conductive pattern in the same group by each connection component, and each group of the second conductive patterns is interlaced with and insulated from each group of the first conductive patterns. Then, a plurality of curved insulation mounds are formed on the substrate. Each insulation mound covers at least a portion of each connection component. Lastly, a plurality of bridge components are formed on the insulation mounds. Each second conductive pattern is electrically connected to another adjacent second conductive pattern in the same group by each bridge component.

Another embodiment of the disclosure provides a method of fabricating a capacitive touch panel. The method comprises the following steps. Firstly, a substrate is provided. Then, a plurality of groups of first conductive patterns arranged in a first direction and a plurality of connection components are formed on the substrate. Each first conductive pattern is electrically connected to another adjacent first conductive pattern in the same group by each connection component. Then, a plurality of curved insulation mounds are formed on the substrate. Each insulation mound covers at least a portion of each connection component. Lastly, a plurality groups of second conductive patterns arranged in a second direction and a plurality of bridge components are formed on the substrate. Each group of the second conductive patterns is interlaced with and insulated from each group of the first conductive patterns, and each bridge component is formed on each of the insulation mounds such that each second conductive pattern is electrically connected to another adjacent second conductive pattern in the same group by each bridge component.

Another embodiment of the disclosure provides a method of fabricating a capacitive touch panel. The method comprises the following steps. Firstly, a substrate is provided. Then, a plurality of bridge components are formed on the substrate. Next, a plurality of curved insulation mounds are formed on the substrate. Each insulation mound covers each bridge component and exposes a portion of each bridge component. Lastly, a plurality of groups of first conductive patterns arrange in a first direction, a plurality of groups of second conductive patterns arranged in a second direction, and a plurality of connection components are formed on the substrate. Each first conductive pattern is electrically connected to another adjacent first conductive pattern in the same group by each connection component, each group of the second conductive patterns is interlaced with and insulated from each group of the first conductive patterns, and each second conductive pattern is electrically connected to another adjacent second conductive pattern in the same group by each bridge component below each insulation mound.

BRIEF DESCRIPTION OF THE DRAWINGS

These and other objectives of the present disclosure will no doubt become obvious to those of ordinary skill in the art after reading the following detailed description of the preferred embodiment that is illustrated in the various FIGS. and drawings.

DETAILED DESCRIPTION

Figure 1:
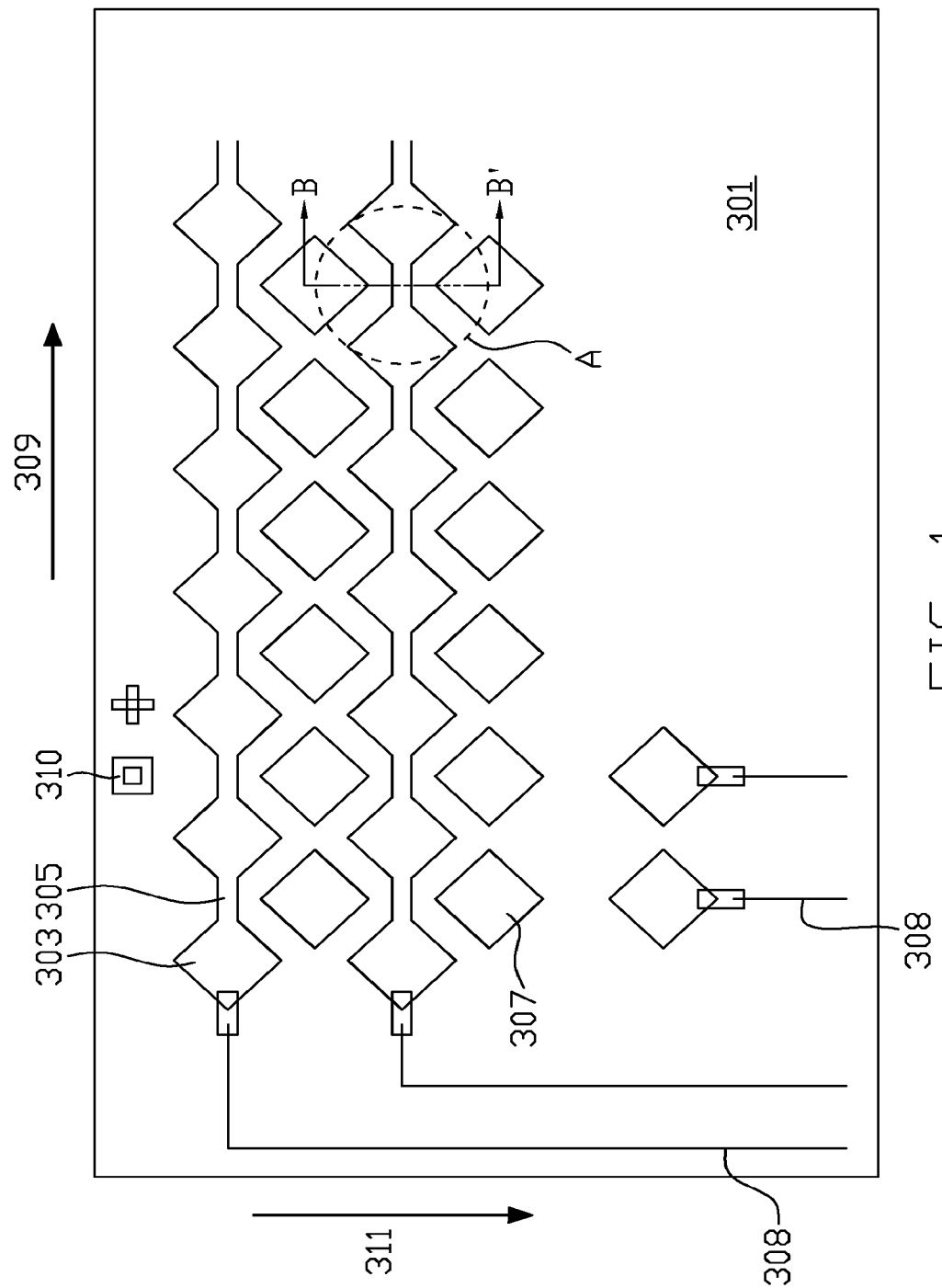
FIG. 1 illustrates a schematic diagram of a first embodiment of a method of fabricating a capacitive touch panel in the present disclosure.

FIGS. 1-8, illustrate schematic diagrams of a first embodiment of a method of fabricating a capacitive touch panel in the present disclosure. Referring to FIG. 1, a substrate 301 is provided at first. The substrate 301 may include organic materials or inorganic materials, such as glass, quartz, plastics, resins, acrylic or other suitable transparent materials. Then, a transparent conductive layer (not shown) is formed on the substrate 301. The transparent conductive layer may be a single layer or a multi layer, and it may include a variety of conventional transparent conductive materials, such as indium-tin-oxide (ITO), indium-zinc-oxide (IZO), zinc-oxide-aluminum (AZO), zinc-oxide-gallium (GZO) or magnesium-indium-oxide (MIO).

Then as shown in FIG. 1, a photo-etching-process (PEP) is provided to pattern the transparent conductive layer to form a plurality of groups of first conductive patterns 303, a plurality of groups of second conductive patterns 307, and a plurality of connection components 305 on the surface of the substrate 301. Among them, each group of the first conductive patterns 303 is arranged along a first direction 309 and each group of the second conductive patterns 307 is arranged along a second direction 311. Each first conductive pattern 303 is electrically connected to another adjacent first conductive pattern 303 in the same group by each connection component 305 as a monolithic art. Each group of the second conductive patterns 307 and each group of the first conductive patterns 305 are interlaced with and insulated from each other.

As shown in FIG. 1, in the embodiment of the present disclosure, the first direction 309 and the second direction 311 are perpendicular. However, the arrangement can be ordered to change the distribution of the conductive patterns, so the first direction 309 and the second direction 311 intersect at a non-perpendicular angle. It should be understood by one of ordinary skill in the art that if the substrate 301 were rotated in a counter-clockwise manner or in a clockwise manner, for example, to make each group of the first conductive patterns 303 be arranged along the second direction 311, and each group of the second conductive patterns 307 be arranged along the first direction 309, such embodiments would represent equivalent changes and modifications of the present disclosure and should be covered by the scope of the present disclosure.

Subsequently, a plurality of wires 308 are formed on the edge of substrate 301. One end of each wire 308 is connected to each group (row) of the first conductive patterns 303 or each group (column) of the second conductive patterns 307, and the other end of each wire 308 stretches to the edge of the substrate 301 to serve as an outer panel control circuit in the subsequent steps. The step of forming the wires 308 may also include forming at least one alignment mark 310 on the edge of the substrate 301. The alignment mark 310 can help to calibrate the position in the follow-up manufacturing processes. The step of forming the wires 308 and the alignment mark 310 are not limited to being performed after the formation of the first conductive patterns 303, the second conductive patterns 307, and the connection components 305. The wires 308 and the alignment mark 310 may also be formed before the formation of the first conductive patterns 303, the second conductive patterns 307, and the connection components 305, or the wires 308, the alignment mark 310, the first conductive patterns 303, the second conductive patterns 307, and the connection components 305 may also be formed simultaneously. The step may also be placed between other steps when not affecting the processes.

Figure 2:
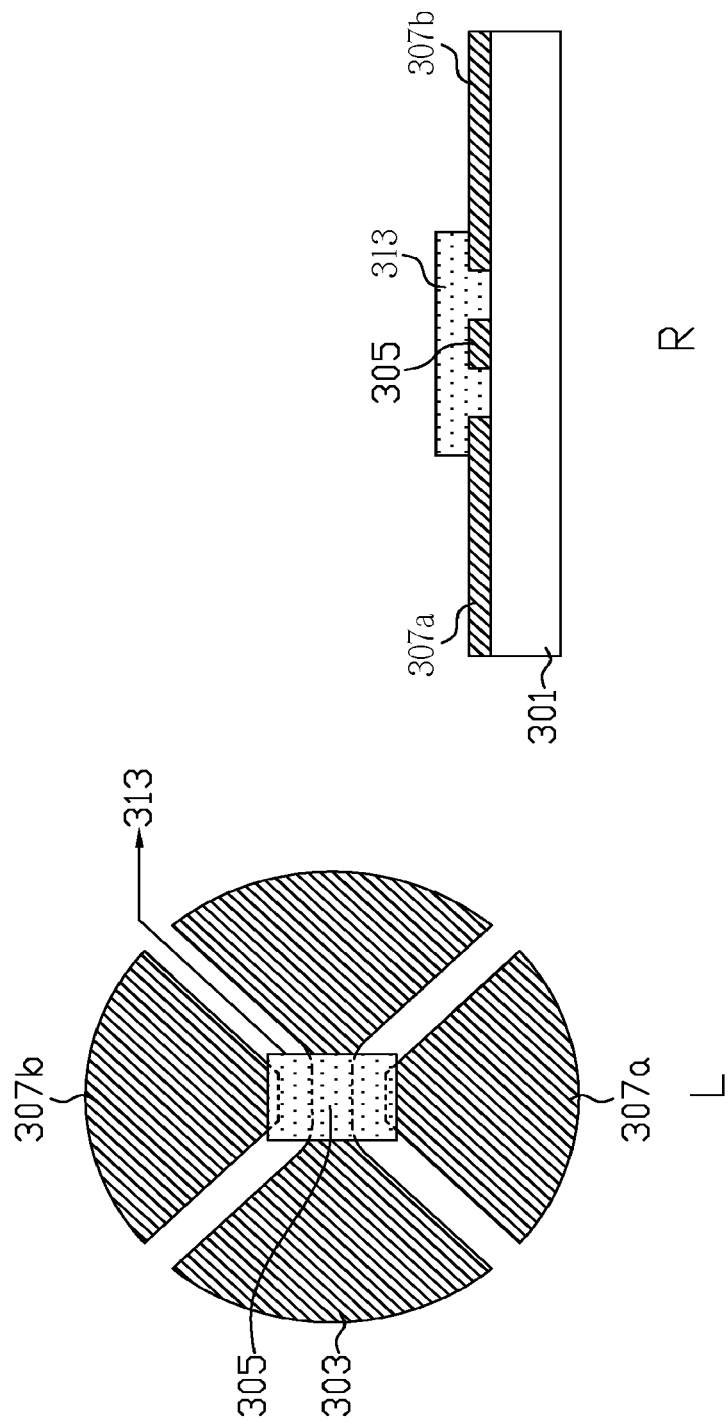
FIG. 2 illustrates a left part L showing an enlarged schematic diagram of the circle A in FIG. 1, and a right part R showing a cross sectional diagram along line BB' in circle A.

FIG. 2 shows a left part L showing an enlarged schematic diagram of the circle A in FIG. 1, and a right part R showing a cross sectional diagram along line BB' in circle A, so as to provide more detailed illustration of the manufacturing process between each component in the embodiment of the present disclosure. As shown in FIG. 2, a photoresist layer or other photosensitive insulation layer (not shown) is formed on the substrate 301. After the position calibration by the alignment mark 310, a lithography process is performed on the photoresist layer, for example, an exposure process and a development process, so as to form a plurality of photoresist patterns 313. Each photoresist pattern 313 covers the corresponding connection components 305. In one embodiment, each photoresist pattern 313 covers at least each corresponding connection component 305 and a portion of each adjacent first conductive pattern 303, as shown in FIG. 2.

Figure 3:
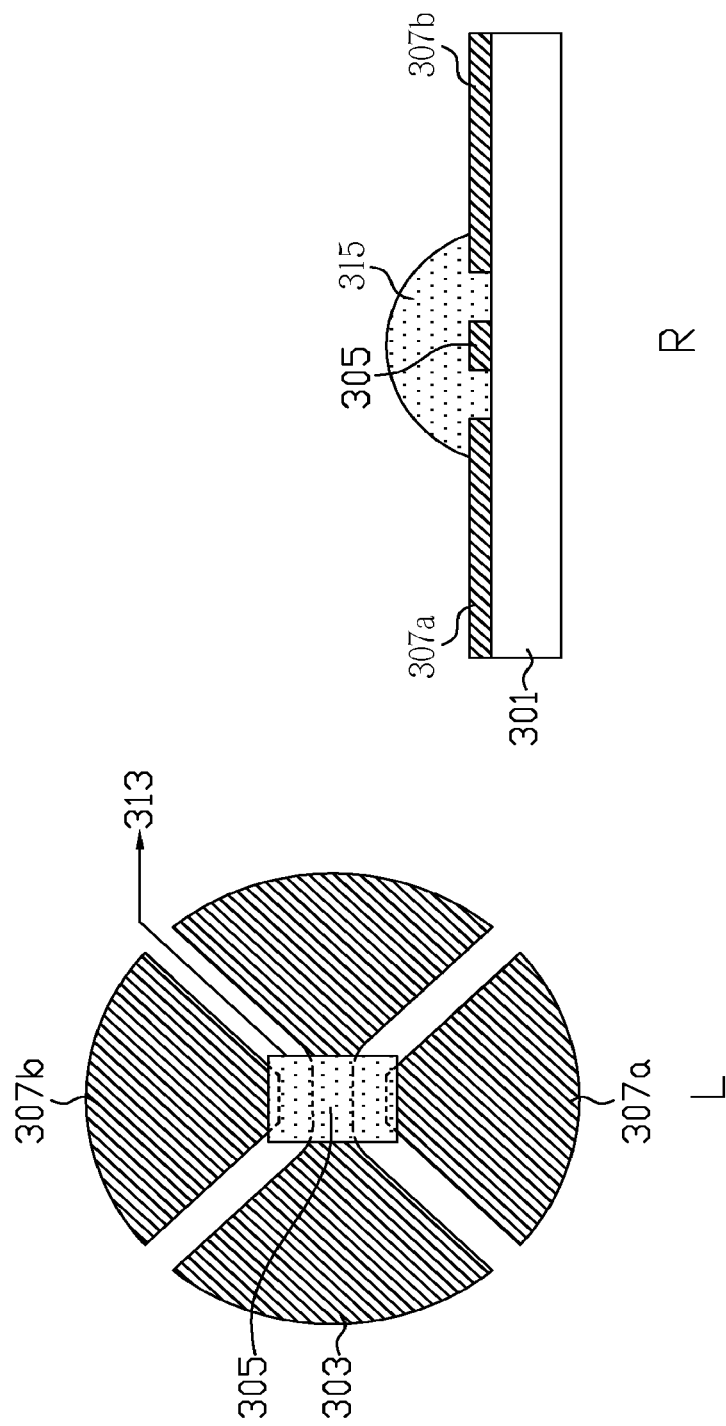
FIG. 3 illustrates a schematic diagram of a curved insulation mound after a baking process.

In FIG. 3, a baking process (not shown) is performed. The temperature of the baking process is between about 200 to 300 degrees Celsius, for example 220 degrees Celsius, for about one hour. During the baking process, a cohesion phenomenon occurs on each photoresist pattern 313, thereby forming a curved insulation mound 315 respectively.

It should be understood that compared to a conventional photoresist layer, which will be removed after the photo-etching-process, the insulation mound 315 in the embodiment of the present disclosure will not be removed. The insulation mound 315 is formed directly from the photoresist pattern 313 after the baking process. Since the insulation mound 315 will not be removed, in addition to having the photosensitivity property, the persistence and stability of the selected materials of the photoresist pattern 313 should be considered as well, so as to provide solidity and a supporting function of the insulation mound.

In addition to the aforementioned process to form the insulation mound 315 directly from the photoresist layer 315, the insulation mound 315 can also be fabricated by using a photo-etching process. For example, an insulation layer is formed on the substrate at first and then the insulation layer is etched to form a plurality of insulation patterns that cover a portion of each connection component respectively. Then, a thermal reflow process is provided to make each insulation pattern become a curved insulation mound 315. Alternatively, the insulation mound 315 in the embodiment of the present disclosure can also be formed by an inkjet printing process.

Figure 4:
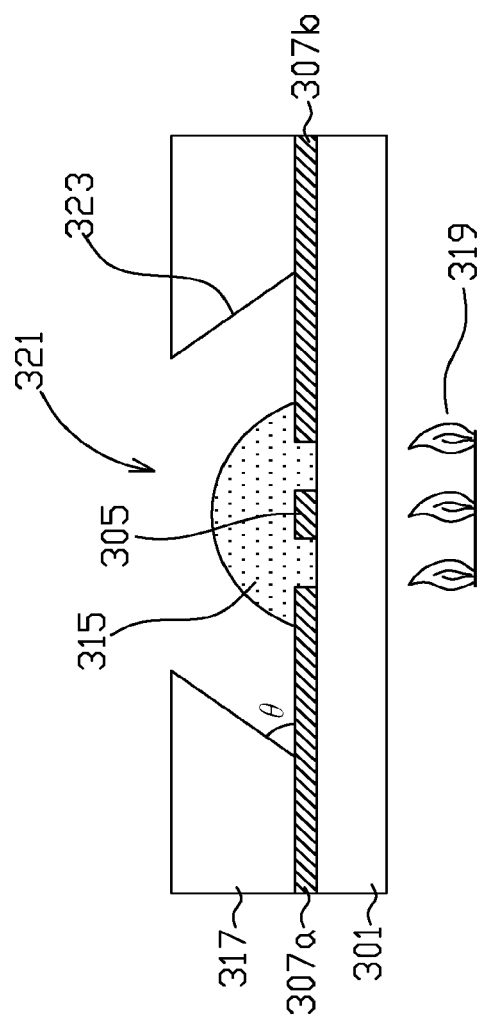
FIG. 4 illustrates a schematic diagram of forming a patterned mask layer on a substrate according to the first embodiment in the present disclosure.

After forming the insulation mound 315, please refer to FIG. 4. A photoresist layer 317 is deposited on the substrate 301 comprehensively, and the photoresist layer 317 includes a lift-off photoresist material. Then, a soft baking process is performed. By the position calibration of the alignment marks 310, an exposure process is then performed. Substantially, a baking process 319 is performed on the substrate 301. Particularly, this baking process 319 may bake the bottom of the substrate 301, that is, the bottom of the photoresist layer 317 is baked by the heat conduction from the substrate 301 in the baking process. The temperature of the baking process is between 80 to 120 degrees Celsius, for example 100 degrees Celsius, for about 90 seconds. Then a development process and a hard baking process are performed on the photoresist 317 to form a patterned mask layer 317 having a plurality of holes 321. Each hole 321 exposes each corresponding insulation mound 315 and a portion of each second conductive pattern 307. As the baking process 319 is applied to the bottom of the substrate 301 prior to the development process, each hole 321 of the patterned mask layer 317 may include an opening structure that shrinks from bottom to top and a tilt sidewall 323, as shown in FIG. 4. In the embodiment of the present disclosure, the angle .theta. between the tile sidewall 323 and the substrate 301 is less than 90 degrees, preferably, 45 degrees.ltoreq..theta.<90 degrees.

Figure 5:
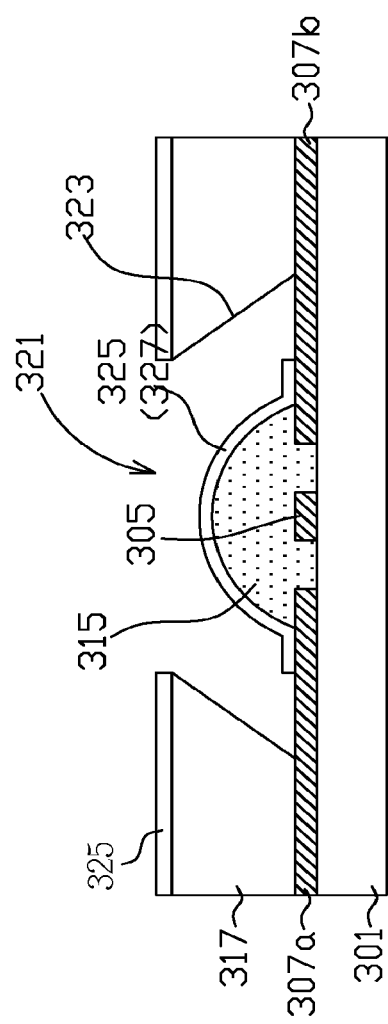
FIG. 5 illustrates a schematic diagram of forming a conductive film on the substrate according to the first embodiment in the present disclosure.

Referring to FIG. 5, a conductive film 325 is formed comprehensively on the substrate 301. The conductive film 325 may include a variety of transparent conductive materials, such as ITO or IZO, or a variety of metal materials, such as copper or aluminum. Especially, the step of forming the conductive film 325 in the embodiment of the present disclosure uses a non-isotropic deposition process, e.g. a sputtering process or an evaporation process. Accordingly, as the holes 321 have a "top-small, bottom-large" structure, when the conductive film 325 is deposited on the substrate 301 in a non-isotropic manner, the conductive film 325 (whether made of ITO or metal) only covers the surface of the patterned mask layer 317, each insulation mound 315 in each hole 321, and a portion of each second conductive pattern 307. Besides, the conductive film 325 is not formed on the tile sidewall 323 of the hole 321 by the shielding of the patterned mask layer 317. As shown in FIG. 5, the conductive film 325(327) is formed along the curvature of the insulation mound 315 and the conductive film 325 connects two adjacent second conductive patterns 307a, 307b electrically.

Figure 6:
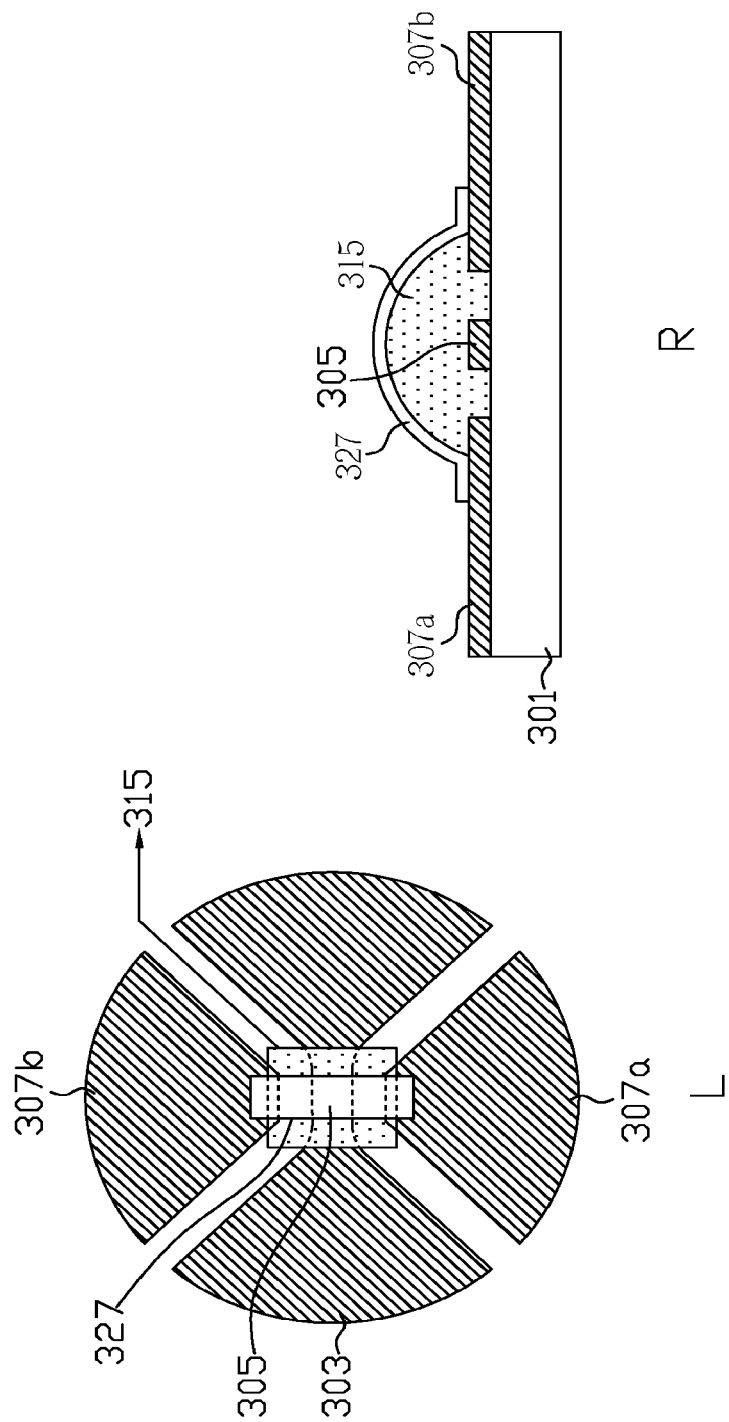
FIG. 6 illustrates a schematic diagram of removing the patterned mask layer in FIG. 5.

Please refer to FIG. 6. The patterned mask layer 317 is removed, for example, by using an appropriate cleaning solution. As the tile sidewall 323 of the holes 321 is not covered by the conductive film 325, a portion of the patterned mask layer 317 is thus exposed to the external environment. Therefore, the cleaning solution can contact the patterned mask layer 317 and remove it, as well as the conductive film 325 covering the patterned mask layer 317. But the conductive film 325 on the insulation mound 315 is not removed. In this way, two adjacent second conductive patterns 307a, 307b in the same group (column) are electrically connected by the conductive film 325 disposed therebetween, and the conductive film 325 atop the insulation mound 315 becomes a bridge component 327.

Figure 7:
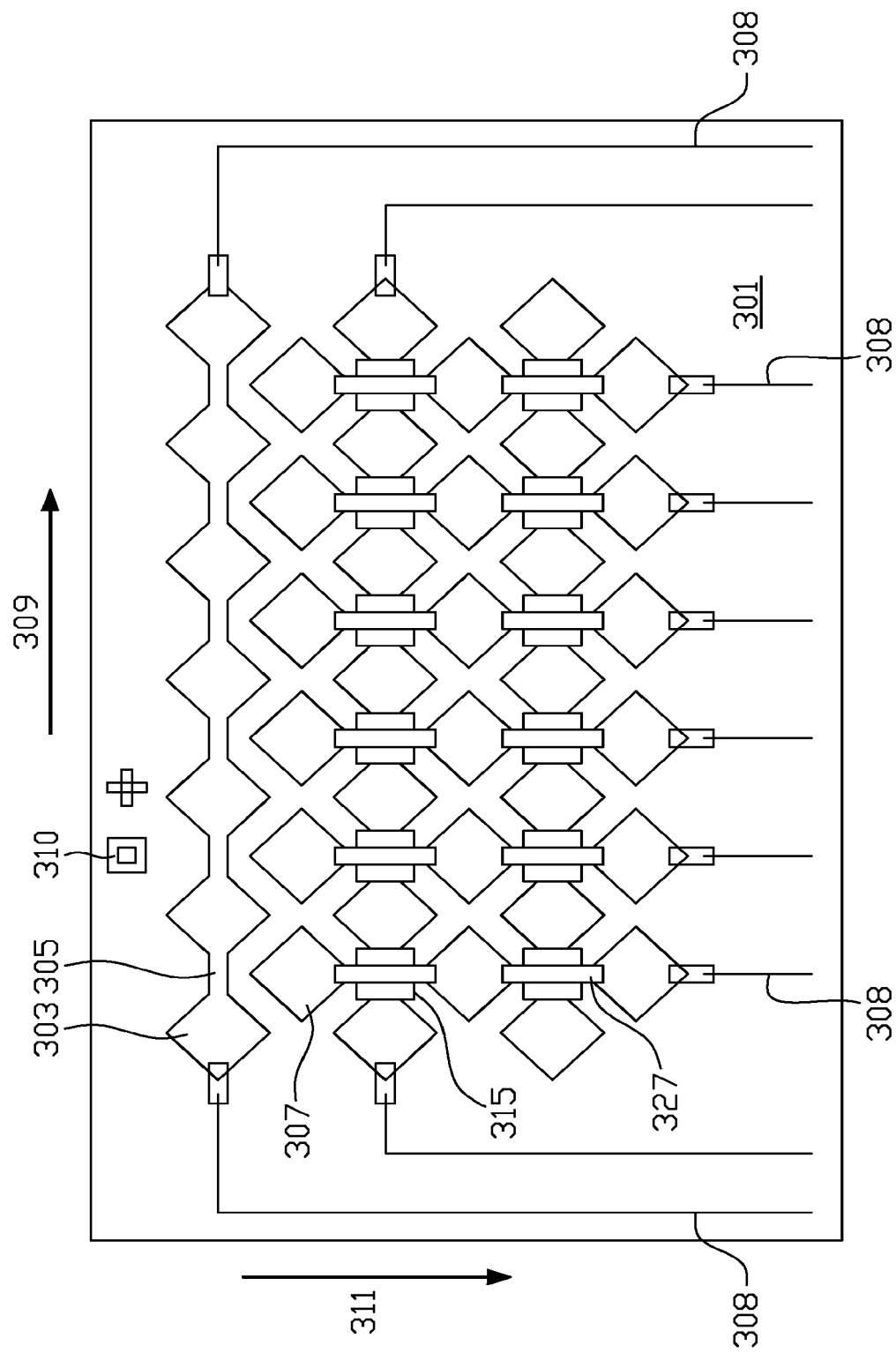
FIG. 7 illustrates a schematic diagram showing a plurality of groups (rows) of the first conductive patterns and a plurality of groups (columns) of the second conductive patterns arranged in different directions formed on the same side of the substrate according to the first embodiment in the present disclosure.

With the above steps, a plurality of groups (rows) of the first conductive patterns 303 and a plurality of groups (columns) of the second conductive patterns 307 arranged in different directions can be formed on the same side of the substrate 301, as shown in FIG. 7. The first conductive patterns 303 in the same group (row) are connected by the connection components 305 and extend along the first direction 309, while the second conductive patterns 305 in the same group (column) are connected by the bridge components 327 and extend along the second direction 311. Each bridge component 327 straddles each insulation mound 315, so the insulation between the first conductive patterns 303 and the second conductive patterns 307 can be maintained. Accordingly, the layout formed by the first conductive patterns 303 and the second conductive patterns 307 on one surface of the substrate 301 can serve as the sensor electrodes of the capacitive touch screen, which can detect the touch position by measuring the axis degrees along the first direction 309 and the second direction 309.

Figure 8:
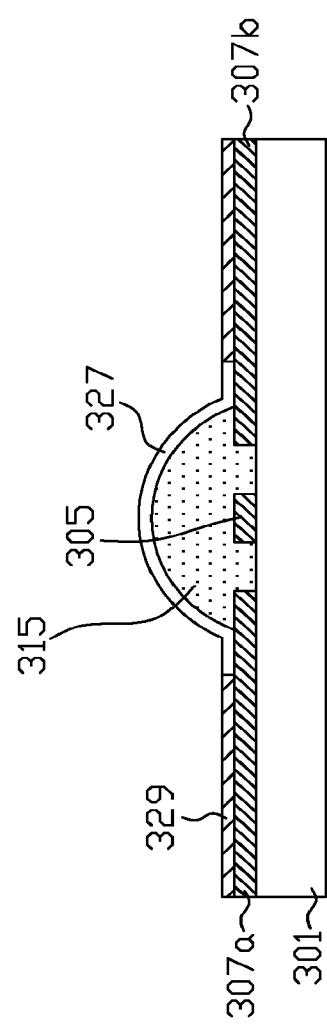
FIG. 8 illustrates a schematic diagram of forming a metal layer on the substrate according to the first embodiment in the present disclosure.

In addition, if the bridge component 327 is made of metal, due to differences in etching selectivity, the metal manufacturing process of the bridge component 327 does not affect the first conductive patterns 303, the second conductive patterns 307, and the connection components 305 which are made by ITO. So, a conventional metal patterning process can be carried out directly to replace the step in FIG. 4 and FIG. 5. For example, after forming the insulation mound 315 as shown in FIG. 3, a metal layer 329 referring to FIG. 8 is formed comprehensively on the substrate 301 and then patterned to form each of the bridge components 327 as shown in FIG. 6. Because the size of the bridge component 327 disposed between the second conductive patterns 307a, 307b is small, the light transmittance may not be affected. On the other hand, the metal with low resistance can compensate for the interface effects between the second conductive patterns 307a, 307b and the bridge components 327, thereby obtaining a better electrical connection rate.

Figure 9:
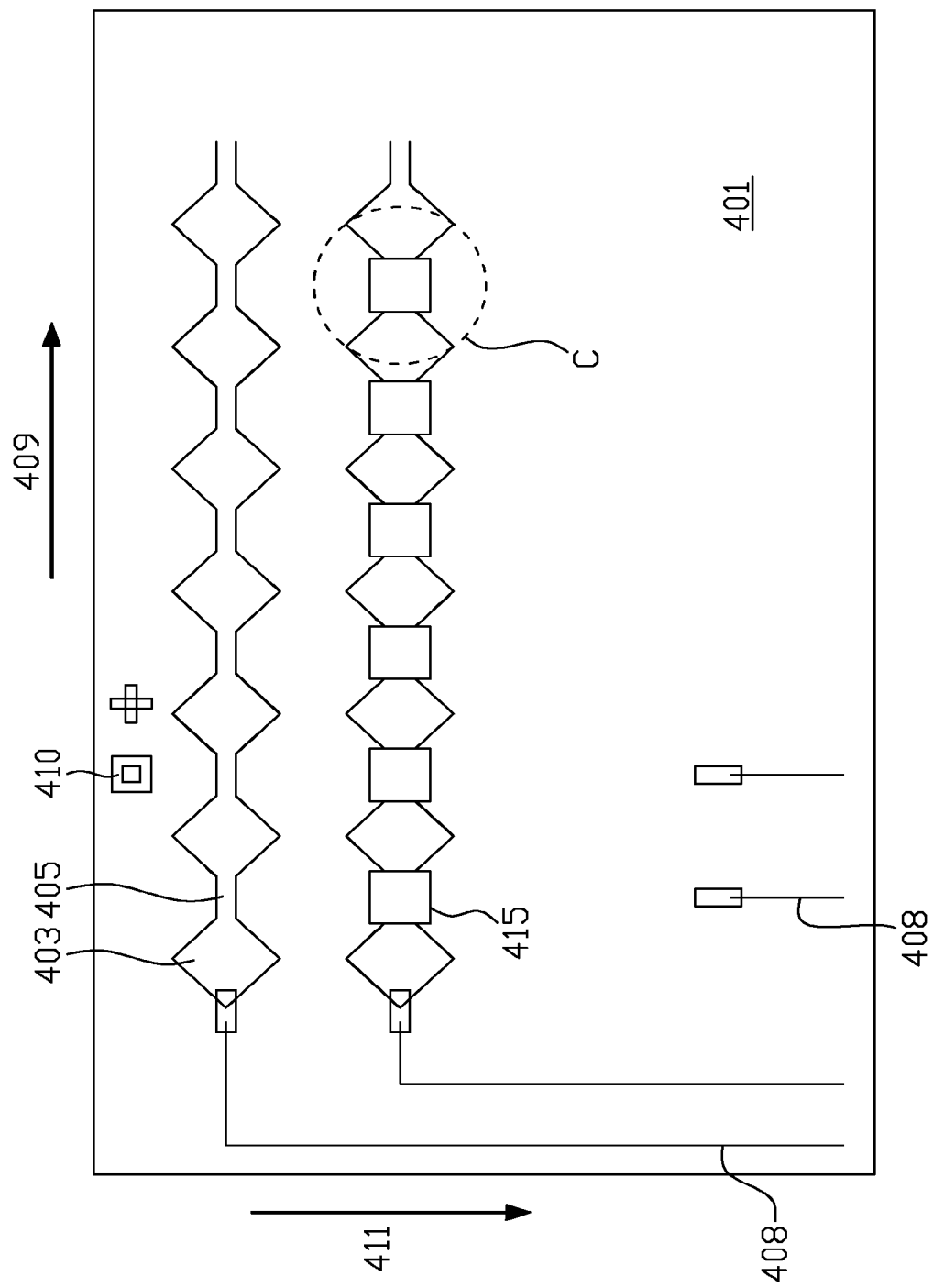
FIG. 9 illustrates a schematic diagram of first conductive patterns and connection components according to a second embodiment of a method of fabricating a capacitive touch panel in the present disclosure.
Figure 10:
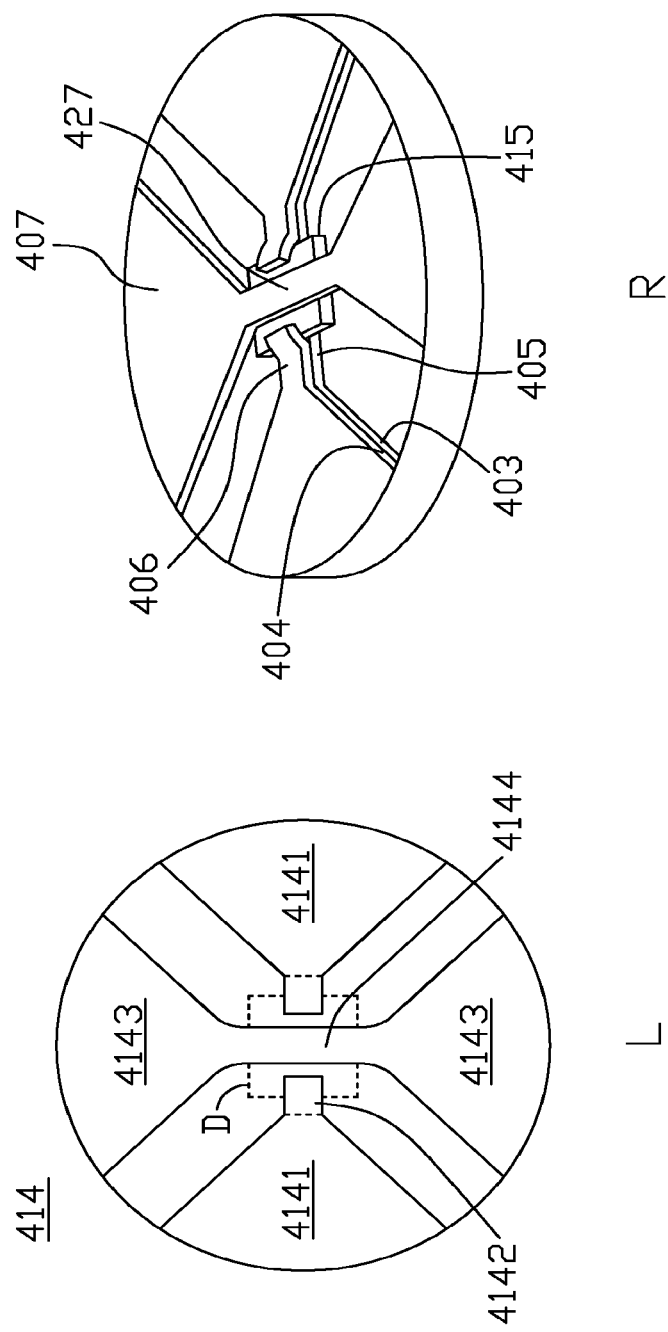
FIG. 10 illustrates an enlarged schematic diagram of the circle C in FIG. 9.
Figure 11:
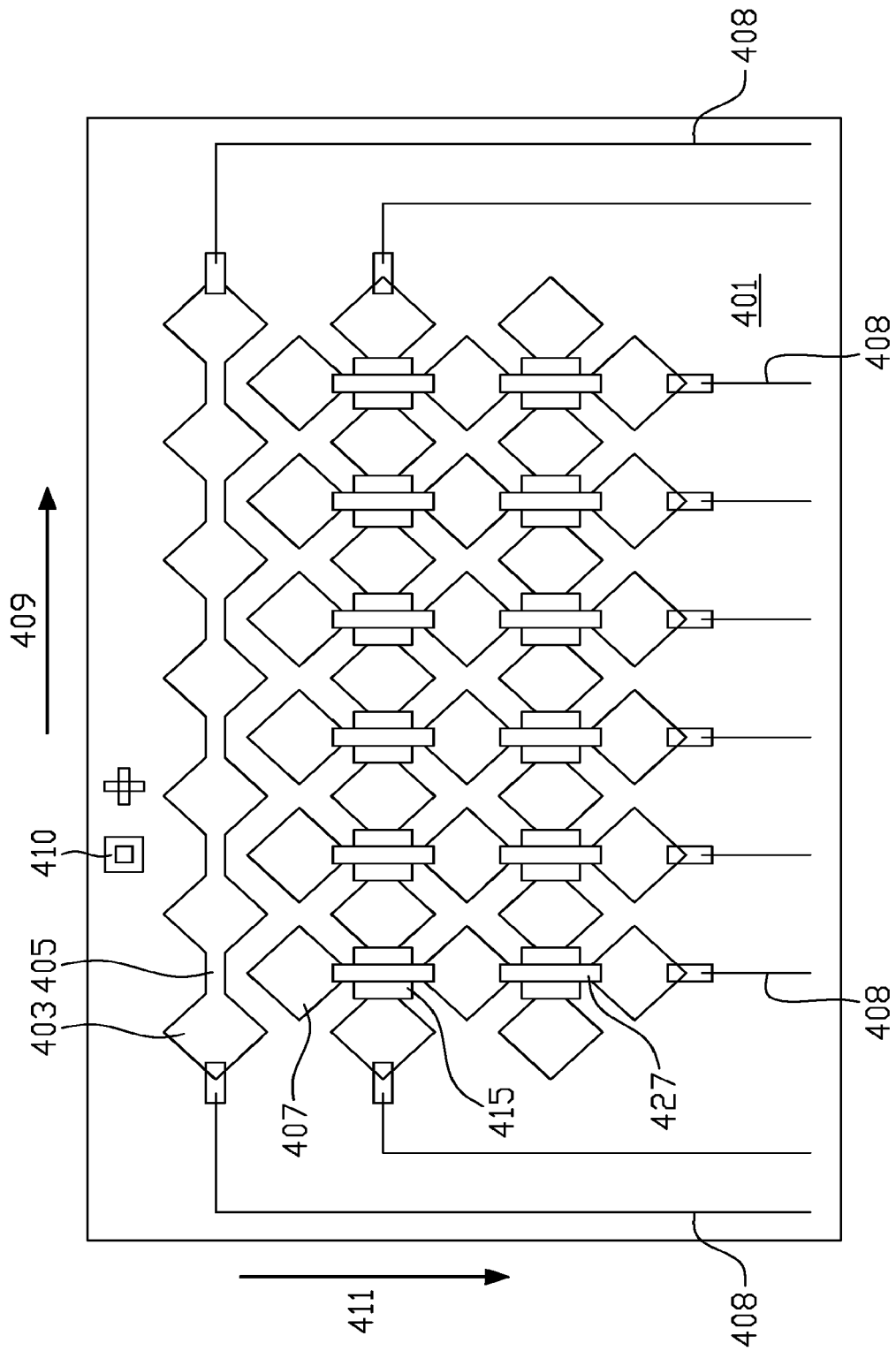
FIG. 11 illustrates a schematic diagram showing a plurality of groups (rows) of the first conductive patterns and a plurality of groups (columns) of the second conductive patterns arranged in different directions formed on the same side of the substrate according to the second embodiment in the present disclosure.

In the second embodiment of the present disclosure, the first conductive pattern and the connection component can be formed first, the insulation mound is formed next, and the second conductive pattern and the bridge component are formed last. Please refer to FIG. 9 to FIG. 11, illustrating schematic diagrams of the second embodiment of the method of fabricating the capacitive touch panel in the present disclosure. As shown in FIG. 9, a substrate 401 is provided at first. Then, a plurality of groups of first conductive patterns 403 arranged in the first direction 409 and a plurality of connection components 405 are formed on the substrate 401. Each first conductive pattern 403 is connected to another adjacent first conductive pattern 403 in the same group by each connection component 405. The first conductive patterns 403 and the connection components 405 can be formed simultaneously and are monolithic. The first conductive patterns 403 and the connection components 405 include a variety of transparent materials such as ITO, which is fabricated by the similar process as that shown above and is not described again.

Subsequently, a plurality of curved insulation mounds 415 is formed. Each insulation mound 415 covers at least a portion of each connection component 405. The fabricating method of the insulation mound 415 is similar as shown above and is not described again.

Then, a plurality of groups of second conductive patterns 407 and a plurality of bridge components 427 are formed on the substrate 401. The formation of the second conductive patterns 407 and the bridge components 427 can use the aforementioned lift-off photoresist, as shown in FIG. 4 to FIG. 6. The only difference is that the exposed scope of the holes 321 may enlarge from the original bridge components 327 to the second conductive patterns 407 and the bridge components 427. The details are the same and will not be described again. In another way, please refer to FIG. 10, which shows an enlarged schematic diagram of the circle C in FIG. 9. The left part L is the schematic diagram showing the mask pattern 414 (described below) in the circle C, and the right part R is the 3D schematic diagram of the circle C. First, a transparent conductive film (not shown) is formed on the substrate 401 comprehensively, followed by a deposition process to form a photoresist layer (not shown) thereon. Then, a PEP process is provided by using the mask pattern 414 as shown in the left part L in FIG. 10. The mask pattern 414 includes four regions. Region 4141 corresponds to the first conductive pattern 403. Region 4142 corresponds to connection component 405. Region 4143 corresponds to the second conductive pattern 407. Region 4144 corresponds to the bridge component 427. Region 4142 corresponds to each already-formed connection component 405 that is covered by each insulation mound 415. However, region 4142 slightly protrudes into the region of the insulation mound 415 (the insulation mound 415 is shown as the block D by a dotted line). Therefore, after the PEP process, the conductive film becomes the second conductive pattern 407, the bridge component 427, an auxiliary first conductive pattern 404 and an auxiliary connection component 406, and the second conductive pattern 407, the bridge component 427, the auxiliary first conductive pattern 404, and the auxiliary connection component 406 correspond to the regions 4143, 4144, 4141, and 4142 respectively, as shown in the right part R in FIG. 10. In particular, the auxiliary first conductive pattern 404 is formed on the already existing first conductive pattern 403 and the auxiliary connection component 406 is formed on the part of the connection component 405 that is uncovered by the insulation mound 415, thereby forming a double-layer conductive structure, as shown in FIG. 10. As the region 4142 of the mask pattern 414 protrudes slightly into the insulation mound 415, the corresponding auxiliary connection component 406 is disposed not only on the connection component 405 but also on a portion of the insulation mound 415. The protruding structure ensures the electrical connection between the auxiliary connection component 406 and the below connection component 405, thus preventing their breakage.

The second conductive patterns 407 and bridge components 427 can also be formed in two separate steps. For instance, when the bridge components 427 are made by metal, the above-mentioned two ways to form the second conductive patterns 407 can be used. Then a metal manufacturing process is carried out to form the bridge components 427. The metal manufacturing process is similar with the embodiment shown in FIG. 8, which will not be described again.

Please refer to FIG. 11. By using the above method, the second conductive patterns 407 and bridge components 427 can be formed on the substrate 401. Each group of the second conductive patterns 407 is interlaced with and insulated from each group of the first conductive patterns 403. Each bridge component 427 is formed on each insulation mound 415, allowing the second conductive patterns 407 to be connected to another adjacent second conductive pattern 407 in the same group through the bridge component 427.

The method in this embodiment can also form a double ITO layer along the first direction 409 and along the second direction 411. When using the photo-etching process to form the first conductive pattern 403 and the connection component 405, the plurality of auxiliary second conductive patterns (not shown) can also be formed along the second direction 411. Then, the insulation mound is formed thereon, which is fabricated by the same method described. Then, the mask pattern 414 as shown in the left part L in FIG. 10 may be used to form the second conductive patterns 407, the auxiliary first conductive patterns 404 and the auxiliary connection components 406.

In this embodiment of the present disclosure, the first direction 409 and the second direction 411 are perpendicular. However, the arrangement can be ordered to change the distribution of the conductive patterns, so the first direction 409 and the second direction 411 intersect at the non-perpendicular angle. In another embodiment, the substrate 401 can be rotated in a counter-clockwise manner or in a clockwise manner, for example, to make each group of the first conductive patterns 403 be arranged along the second direction 411, and each group of the second conductive patterns 407 be arranged along the first direction 409. The method in the present embodiment further includes forming a plurality of wires 408 and at least an alignment mark 410. For example, the wires 408 and the alignment mark 410 can be formed by a metal manufacturing process before the formation of the first conductive patterns 403 and the connection components 405. The step may also be placed between other steps when not affecting the processes.

Figure 12:
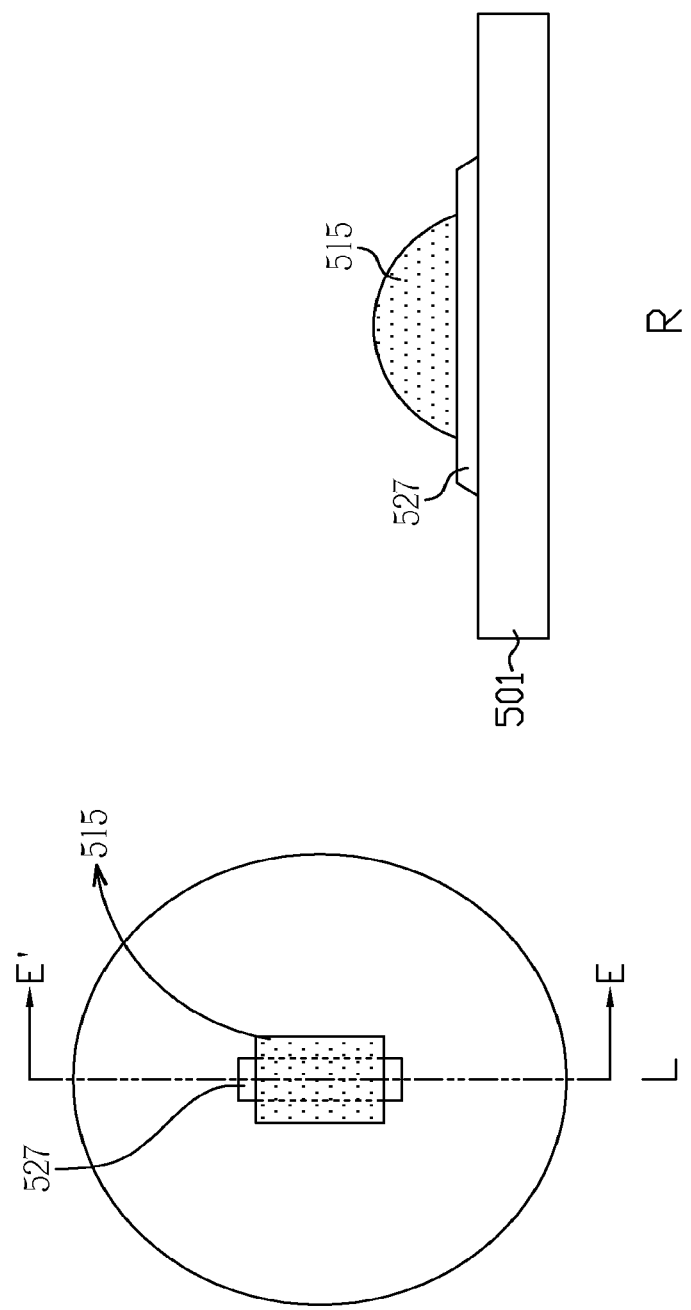
FIG. 12 illustrates a schematic diagram of bridge components and curved insulation mounds according to a third embodiment of a method of fabricating a capacitive touch panel in the present disclosure.
Figure 13:
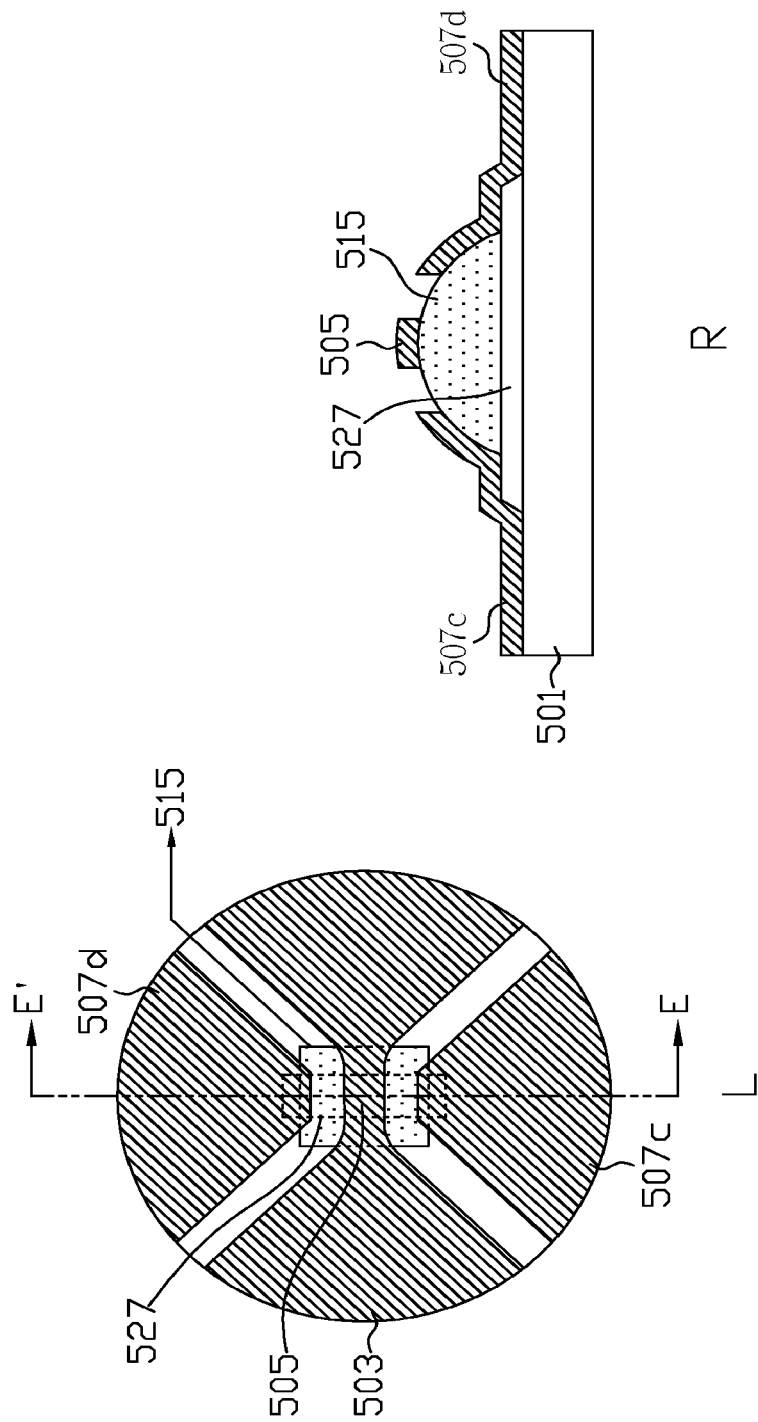
FIG. 13 illustrates a schematic diagram of forming a plurality of groups of first conductive patterns, a plurality of groups of second conductive patterns, and a plurality of connection components according to the third embodiment in the present disclosure.
Figure 14:
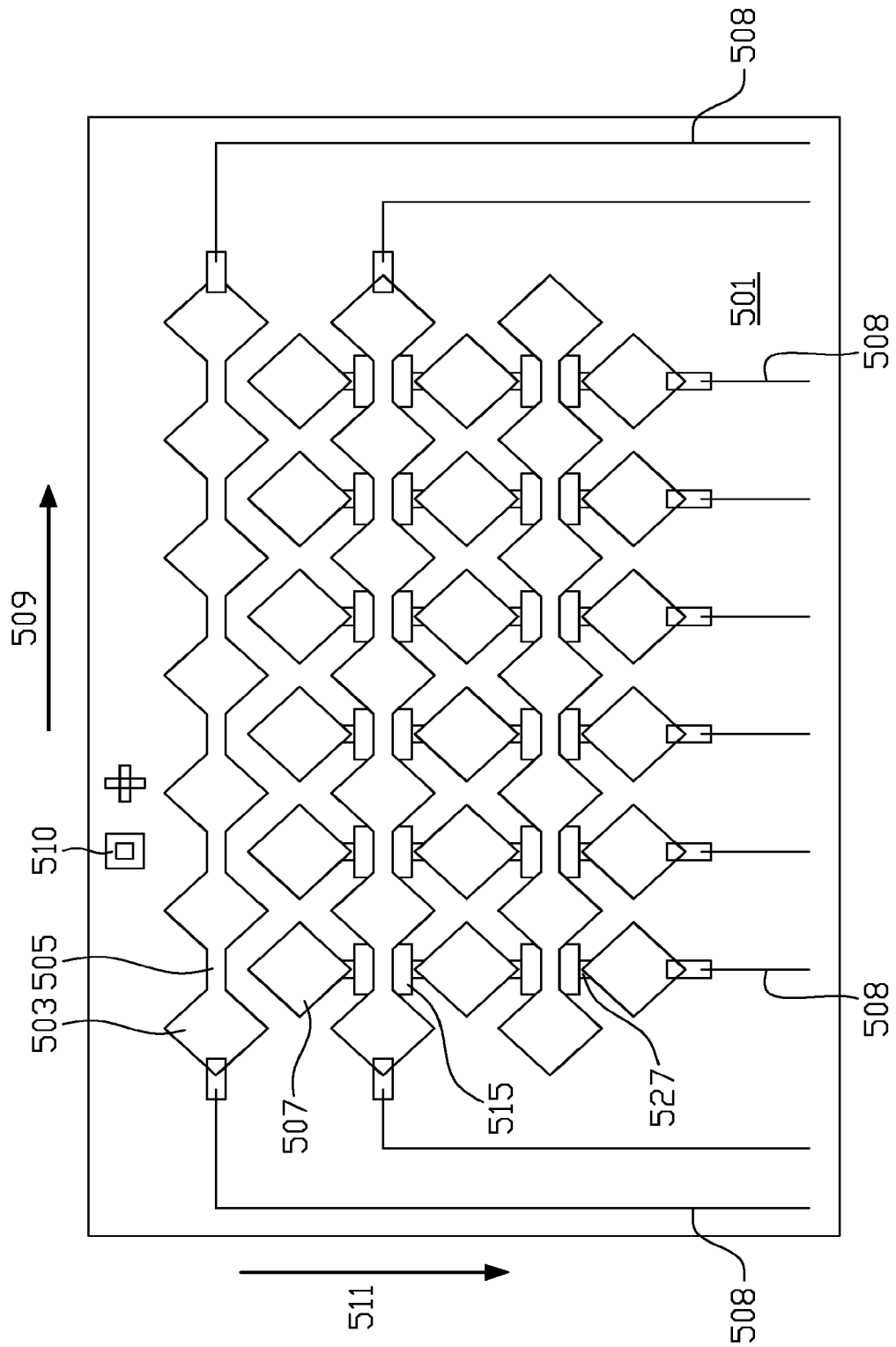
FIG. 14 illustrates a schematic diagram showing a plurality of groups (rows) of the first conductive patterns and a plurality of groups (columns) of the second conductive patterns arranged in different directions formed on the same side of the substrate according to the third embodiment in the present disclosure.

In the third embodiment of the present disclosure, the bridge components can be formed first, the insulation mounds next, and the first conductive patterns, the second conductive patterns, and the connection components formed simultaneously last. Please refer to FIG. 12 to FIG. 14, illustrating the schematic diagrams of the third embodiment of the method of fabricating a capacitive touch panel in the present disclosure. FIG. 12 and FIG. 13 include a left part L and a right part R, and the right part R is the cross sectional diagram along line EE' of the left part. Please refer to FIG. 12 first. A plurality of bridge components 527 are formed on a substrate 501. Then a plurality of curved insulation mounds 515 are formed on the substrate 501, each of which covers each corresponding bridge component 527 and exposes both ends of each bridge component 527. The bridge components 527 may include transparent conductive material or metal, which may be formed by a conventional exposure process or development process. The insulation mounds 515 are fabricated by the similar process mentioned above, which will not be described again.

Please refer to FIG. 13. A transparent conductive layer (not shown) is formed on the substrate 501 and patterned to form a plurality of groups of first conductive patterns 503, a plurality of groups of second conductive patterns 507, and a plurality of connection components 505. The arrangement and position of each component is the same as the description in FIG. 7. Each first conductive pattern 503 is connected to another adjacent first conductive pattern 503 in the same group (row) by each connection component 505 and each group of the second conductive patterns 507 is interlaced with and insulated from each group of the first conductive patterns 503. As the bridge components 527 have been formed on the surface of the substrate 501, two adjacent second conductive patterns 507c, 507d can be electrically connected to each other by the bridge component 527 below the insulation mound 527. As shown in FIG. 14, the first conductive patterns 503 in the same group are connected by the connection components 505 and extend along the first direction 509; the second conductive patterns 507 in the same group are connected by the bridge components 527 buried below the insulation mound 515 and extend along the second direction 511, forming the sensor electrode array to provide an excellent touch panel structure.

Similarly, the first direction 509 and the second direction 511 in this embodiment are perpendicular. The arrangement can also be ordered to change the distribution of the conductive patterns, so the first direction 509 and the second direction 511 intersect at a non-perpendicular angle. The substrate 501 can be rotated in a counter-clockwise manner or in a clockwise manner, for example, to make each group of the first conductive pattern 503 be arranged along the second direction 511, and each group of the second conductive pattern 507 be arranged along the first direction 509. The method in the present embodiment further includes forming a plurality of wires 508 and at least an alignment mark 510 on edge of the substrate 501. If the bridge component 527 is made by metal, the wire 508 and the alignment mark 510 can be formed on edge of the substrate 501 simultaneously when forming the bridge component 527 in the beginning, saving one step and providing more position calibration. The step may also be placed between other steps when not affecting the processes.

Accordingly, the capacitive touch panel fabricated by the third embodiment, as shown in FIG. 13 and FIG. 14, includes a substrate 501, a plurality of groups of first conductive patterns 503, a plurality of groups of second conductive patterns 507, a plurality of connection components 505, a plurality of bridge components 527, and a plurality of insulation mounds 515, all of which are disposed on the same side of the substrate 501. Each insulation mound 515 covers each bridge component 527 and exposes a portion of each bridge component 527. The connection component 505 straddles the insulation mound 515. The insulation mound 515 is not limited to the curved shape formed by the aforementioned process, but may be an insulation protrusion in any shape. Each group of the first conductive patterns 503 is arranged along a first direction 509 and each group of the second conductive patterns 507 is arranged along a second direction 511. The first conductive pattern 503 is electrically connected to another adjacent first conductive pattern 503 in the same group by the connection component 505 therebetween, and the second conductive pattern 507 is electrically connected to another adjacent second conductive pattern 507 in the same group by the bridge component 527 buried below the insulation mound 515 therebetween.

In light of the above, the embodiments of the present disclosure provide a method of fabricating a capacitive touch panel with fewer layers and higher light transmittance. The capacitive touch panel includes a novel bridge structure which can reduce the thickness and the number of stacking layers, thereby solving the conventional problems of low light transmittance and complicated fabrication process.

In addition, as the insulation mound used in the embodiments of the present disclosure includes a curved structure, the connection component or the bridge component can be formed along the surface of the curved structure, forming an arc-shaped bridge structure. In this way, the ruptured or poor contact phenomenon resulting from the conventional bridge structure formed at a vertical or sharp corner surface can be avoided, greatly improving product yields as well as its lifespan.

In addition, the embodiments of the disclosure provide a variety of fabrication methods for the bridge component by considering compatibility between the materials of the first conductive pattern, the second conductive pattern, the connection component, and the bridge component, and are applicable to a variety of materials of the bridge component. When the first conductive pattern, the second conductive pattern, and the connection component are made of transparent conductive material such as ITO, and the bridge component is made by ITO as well, because the patterning process can not use the same etching solution, the first embodiment in the present disclosure therefore provides a fabricating method of forming the bridge component, as shown in FIG. 4 and FIG. 5. The method includes forming a hole with a tilt sidewall, so that during evaporation of the conductive film, the tilt sidewall is not covered by the conductive film. The patterned mask layer and the above conductive film can be removed and the bridge component can be formed when not affecting the first conductive pattern, the second conductive pattern, and the connection component under the patterned mask layer.

If the bridge component is made of metal, in addition to the above-mentioned method provided by the first embodiment, the disclosure further provides the third embodiment. As the metal and ITO layer have an etching selectivity, when the first conductive pattern, the second conductive pattern, and the connection component are made of ITO, and the second conductive pattern is made of metal, the bridge component can be directly formed by a metal manufacturing process, which does not affect the formation of the first conductive pattern, the second conductive pattern, and the connection component. It is known that the electrical conductivity of metal is much greater than that of ITO, so by using the metal as the bridge component, the resistance of the touch panel can be lowered and the sensitivity of the touch panel can be improved.

Based on the above advantages, the embodiments of the present disclosure provide a simple method of fabricating that uses only a few stacking layers and exhibits high light transmittance. A variety of manufacturing processes are also considered to ensure the applicability to any material of the bridge component. A good curved structure is also provided to ensure the integrity of the bridge structure and provide excellent utility for the process.

Those skilled in the art will readily observe that numerous modifications and alterations of the device and method may be made while retaining the teachings of the disclosure.

What is claimed is:

1. A method of fabricating a touch panel, comprising:
   providing a substrate;
   forming a plurality of bridge components on the substrate;
   forming a plurality of insulation mounds on the substrate, wherein each insulation mound covers each bridge component and exposes a portion of each bridge component; and
   forming a plurality of groups of first conductive patterns arrange in a first direction, a plurality of groups of second conductive patterns arranged in a second direction, and a plurality of connection components on the substrate, wherein each first conductive pattern is electrically connected to another adjacent first conductive pattern in the same group by each connection component, each group of the second conductive patterns is interlaced with and insulated from each group of the first conductive pattern, and each second conductive pattern is electrically connected to another adjacent second conductive pattern in the same group by each bridge component below each insulation mound.

2. The method of claim 1, wherein the first conductive patterns and the connection components in the same group are formed simultaneously.

3. The method of claim 1, wherein the step of forming the insulation mounds comprises:
   forming a photoresist layer;
   performing a lithography process on the photoresist layer to form a plurality of photoresist patterns, wherein each photoresist pattern covers each bridge component; and
   performing a baking process to make each photoresist pattern become each insulation mound.

4. The method of claim 3, wherein the temperature of the baking process is between 200 to 300 degrees Celsius.

5. The method of claim 1, wherein the step of forming the insulation mounds comprises:
   forming an insulation layer on the substrate;
   etching the insulation layer to form a plurality of insulation patterns, wherein each insulation pattern covers each bridge component; and
   providing a thermal reflow process to make each insulation pattern become each insulation mound.

6. The method of claim 1, wherein the first conductive patterns, the second conductive patterns, and the connection components comprise transparent conductive material.

7. The method of claim 1, wherein the bridge component includes metal or transparent conductive material.

8. The method of claim 1, further comprising forming a plurality of wires on the edge of the substrate, wherein one side of each wire connects to one group of the first conductive patterns or one group of the second conductive patterns and the other side of each wire stretches to the edge of the substrate.

9. The method of claim 8, wherein the step of forming the wires further comprises forming at least an alignment mark on the edge of the substrate.

10. The method of claim 1, wherein an angle is between the first direction and the second direction.

* * * * *